United States Patent [19]

De Luca et al.

[11] Patent Number: 4,604,299
[45] Date of Patent: Aug. 5, 1986

[54] METALLIZATION OF CERAMICS

[75] Inventors: Michael A. De Luca, Holbrook; John F. McCormack, Roslyn Heights, both of N.Y.

[73] Assignee: Kollmorgen Technologies Corporation, Dallas, Tex.

[21] Appl. No.: 607,874

[22] Filed: May 10, 1984

Related U.S. Application Data

[63] Continuation-in-part of Ser. No. 502,748, Jun. 9, 1983, abandoned.

[51] Int. Cl.⁴ ............................................. B05D 5/12
[52] U.S. Cl. .................................... 427/98; 427/304; 427/305; 427/309; 427/404; 427/443.1
[58] Field of Search .............. 427/309, 305, 304, 343, 427/404, 443.1, 96, 97, 98; 204/32 R, 38 B

[56] References Cited

U.S. PATENT DOCUMENTS

| | | | |
|---|---|---|---|
| 3,296,012 | 1/1967 | Statnecker | 427/309 |
| 3,309,760 | 3/1967 | Reznick et al. | 427/399 |
| 3,628,999 | 12/1971 | Schneble et al. | 427/98 |
| 3,672,986 | 6/1972 | Schneble et al. | 427/98 |
| 3,690,921 | 9/1972 | Elmore | 427/299 |
| 3,744,120 | 7/1973 | Burgess et al. | |
| 3,766,634 | 10/1973 | Babcock et al. | |
| 3,772,056 | 11/1973 | Polichette et al. | 427/404 |
| 3,772,078 | 11/1973 | Polichette et al. | 427/404 |
| 3,907,621 | 9/1975 | Polichette et al. | |
| 3,925,578 | 10/1975 | Polichette et al. | 427/304 |
| 3,930,963 | 1/1976 | Polichette et al. | 427/97 |
| 3,959,547 | 5/1976 | Polichette et al. | 427/404 |
| 3,993,802 | 11/1976 | Polichette et al. | 427/96 |
| 3,994,430 | 11/1976 | Cusano et al. | |
| 3,994,727 | 11/1976 | Polichette et al. | 427/96 |
| 4,428,986 | 1/1984 | Schachameyer | 427/309 |

FOREIGN PATENT DOCUMENTS

| | | | |
|---|---|---|---|
| 3032508 | 4/1982 | Fed. Rep. of Germany | 427/309 |
| 51-47536 | 4/1976 | Japan | 427/98 |
| 53-19932 | 2/1978 | Japan | 427/309 |

OTHER PUBLICATIONS

Ameen et al, "Etching of High Alumina Ceramics to Promote Copper Adhesion," J. Electrochem. Soc., vol. 120, pp. 1518–1522, Nov. 1973.

Bandrand, "Cleaning & Preparation of Ceramics and Metallized Ceramic Materials for Plating," Plating & Surface Finishing, pp. 72–75, Oct. 1984.

Jorgensen et al, "Copper Plating Process for Metallizing Alumina," pp. 347–352, Sep. 1984.

Primary Examiner—Sadie L. Childs
Attorney, Agent, or Firm—Morgan, Finnegan, Pine, Foley & Lee

[57] ABSTRACT

An article comprised of metal directly and adherently bonded onto a ceramic substrate, and a process for producing same, wherein the ceramic is adhesion promoted with molten inorganic compound, treated with halide compounds that promote adsorption of catalyst for metal deposition, and plated with metal. Uniform surface coverage with catalyst and metal is ensured by the halide treatment.

32 Claims, No Drawings

METALLIZATION OF CERAMICS

CROSS REFERENCE TO RELATED APPLICATIONS

This application is a continuation-in-part of U.S. application, Ser. No. 502,748 filed June 9, 1983, now abandoned.

BACKGROUND OF THE INVENTION

1. Field of the Invention

This invention relates to metallized ceramic articles and to a metallized conductor pattern directly and adherently bonded onto a surface of a ceramic substrate, and an improved process for producing the same. More particularly, this invention relates to a printed circuit pattern directly and adherently bonded onto a surface of a ceramic substrate, and an improved process for producing the same employing material in solution to promote adsorption of a catalyst for metal deposition.

2. Description of the Prior Art

Metallized conductor patterns on ceramic substrates have been widely used in the electronic industry. For many years, ceramics have been metallized by high cost processes such as fused metal-glass pastes and thin film vacuum deposition techniques. Attempts to reproducibly make circuit patterns by direct electroless deposition have not been successful due to poor adhesion of the metal films to the substrate and non-reproducible and non-uniform surface coverage.

Printed circuits on ceramics, including alumina, were described as early as 1947. See "Printed Circuit Techniques", National Bureau of Standards, Circular 468 (1947) and National Bureau of Standards, Misc. Pub. 192 (1948). One type, known as a thin film circuit, consists of a thin film of metal deposited on a ceramic substrate by one of the vacuum plating techniques. In these techniques, a chromium or molybdenum film, having a thickness of about 0.02 microns, acts as a bonding agent for copper or gold conductors. Photolithography is used to produce high resolution patterns etched from the thin metal film. Such conductive patterns may be electroplated up to 7 microns thick. Due to their high cost, thin film circuits have been limited to specialized applications such as high frequency applications and military applications where a high pattern resolution is vital.

Another type of printed circuit, known as a thick film circuit, consists of a metal and glass film fired on a ceramic substrate. Typically, the film has a thickness of about 15 microns. Thick film circuits have been widely used. Thick films are produced by screen printing in a circuit pattern with a paste containing a conductive metal powder and a glass frit in an organic carrier. After printing, the ceramic parts are fired in a furnace to burn off the carrier and sinter the conductive metal particles and fuse the glass, thereby forming glass-metal particle conductors. These conductors are firmly bonded to the ceramic by the glass and thus components may be attached to the conductors by soldering, wire bonding and the like.

Conductors in thick film circuits have only 30–60 percent of the conductivity of the pure metal. The high conductivity of pure metal is needed to provide interconnections for high speed logic circuits. Because conductors in thick film circuits do not have such high conductivity, they do not provide optimum interconnections for high speed logic circuits.

The minimum conductor width and the minimum space between conductors which can be obtained by screen printing and firing under special high quality procedures is 125 and 200 microns, respectively. However, under normal production conditions, these minima are 200 and 250 microns, respectively. For ceramic circuits requiring higher interconnection density, i.e., higher connectivity, multilayer techniques are used.

In the thick film multilayer process, a first layer of metal powder and glass frit is printed on a ceramic substrate and fired, typically at 850° C, in a furnace. Then, an insulating dielectric layer is screened over the conductor pattern, leaving exposed only the points at which contact is made to the next layer of metallization. This dielectric pattern also is fired at 850° C. Then, a second dielectric layer is printed and fired. Two layers of dielectric must be printed and fired to ensure that there are no pinholes. After the two layers of dielectric have been printed and fired, the next conductor layer is printed and fired making contact to the lower conductor layer as necessary through the openings left in the dielectric layers.

Typical multilayer ceramic packages contain two to six layers of metallization. Eight layers are not uncommon. For two layers of metallization, the substrate will be printed four times and fired at 850° C. for four times. For three layers of metallization, the substrate will be repetitively printed and fired at 850° C. seven times, and for four layer, thick film, multilayer ceramic, ten times. By the processes of the present invention, the same connectivity as a three or four layer film multilayer ceramic can be achieved by a two-sided, plated through hole, conductor pattern.

Attempts have been made to directly bond pure metal conductors to ceramic substrates including alumina in order to achieve higher conductivity for ceramic based circuit patterns (see U.S. Pat. No. 3,744,120, to Burgess et al. and U.S. Pat. No. 3,766,634 to Babcock et al.). Solid State Technology 18/5, 42 (1975) and U.S. Pat. No. 3,994,430, to Cusano et al., disclose a method for bonding copper sheets to alumina by heating the copper in air to form an oxide film on its surface. The copper sheet then is bonded through this film to alumina at a temperature between 1065° C. and 1075° C. in a nitrogen furnace. In order to obtain well adhered copper foil without blisters: (1) the copper foil must be carefully oxidized to a block surface; (2) the copper oxide thickness must be carefully controlled; (3) the amount of oxygen in the copper foil must be controlled; (4) the oxygen content of the nitrogen furnace must be maintained at a controlled level to maintain a very moderately oxidizing atmosphere; and (5) the temperature must be controlled within one percent. This extreme high temperature operation is difficult and expensive to tool, to operate and to control. If the aforementioned extremely stringent controls are not maintained, blisters and other adhesion failures in the copper foil to subblisters are apparent. In spite of the difficult operating conditions, the process of Cusano et al. is being introduced into commercial application because of the need for the metallized product.

Although the above described systems are commercially used, the need for direct, simple metallization of ceramics with a pure metal conductor, such as copper, has prompted a continuous series of patents and proposed processes. See for example Apfelbach et al., Deutsches Patentschrift (DPS) No. 2,004,133,; Jostan, DPS No. 2,453,192 and DPS No. 2,453,277; and Steiner DPS No. 2,533,524. See also U.S. Pat. No. 3,296,012 to Statnecker which disclosed a method of producing a microporous surface for electrolessly plating alumina. Attempts to simply apply electroless metallization directly to ceramic substrates, have continually been tried and never been commercially successful. Even such toxic and corrosive materials as hydrogen fluoride were tried to allow the direct bonding of electroless metal to ceramics without extreme firing temperatures, Ameen et al., *J. Electrochem. Soc.*, 120, 1518 (1973). However, the hydrofluoric etch gave poor strength due to excessive attack on the surface of the ceramic.

Another attempt, disclosed in U.S. Pat. No. 3,690,921 to Elmore, involved the use of molten sodium hydroxide to first etch a ceramic surface before sensitizing the surface with stannous chloride sensitizer, activating the surface in palladium chloride, and electrolessly plating the surface. Although the sodium hydroxide etch provided a metal film circuit with good bond strength, nonetheless, it did not achieve commercial production. The problem was poor surface coverage by the electrolessly deposited metal. Although the metal deposit usually covered 90% of the surface area or even better, this was insufficient. Any imperfection in a metal film can result in an open circuit, that is, a complete operating failure, if the imperfection occurs in a fine line conductor pattern.

U.S. Pat. No. 4,428,986 to Schachameyer discloses a method for direct autocatalytic plating of a metal film on beryllia. The method comprises uniformly roughening the surface of the beryllia by immersing the beryllia in a 50% sodium hydroxide solution at 250° C. for 7 to 20 minutes, rinsing with water, etching the beryllia substrate with fluoroboric acid for 5 to 20 minutes, rinsing with water, immersing the beryllia in a solution of 5 g/l stannous chloride and 3N hydrochloric acid, rinsing with water, treating the beryllia with 0.1 g/l palladium chloride solution, rinsing with water, and then electrolessly plating nickel on the beryllia. However, the etching step removes the silica and magnesium from the grain boundaries of the beryllia, thereby weakening the beryllia surface. As a result, the method of Schachameyer was able to achieve only 250 psi (1.7 MPa) bond strength before the beryllia substrate broke. This bond strength is low, being approximately a third of the bond strength normal in thick film type circuits.

Other methods of forming printed circuit patterns on ceramic substrates are disclosed in U.S. Pat. Nos. 3,772,056, 3,772,078, 3,907,621, 3,925,578, 3,930,963, 3,959,547, 3,993,802 and 3,994,727. However, there is no teaching in these patents of how to solve the problem of poor surface coverage and inadequate bond strength to ceramic.

Ceramic packages have been widely used to protect microelectronic circuits such as integrated and hybrid circuits from contamination by the outside environment. A hermetic seal is required between the ceramic base of the package and its cover to exclude the outside environment. Heretofore hermetic seals have been provided by the following methods for ceramic dual-in-line packages utilized in the microelectronics industry. In one method, a refractory metal paste, usually moly-manganese, is applied to a ceramic base. The paste and the ceramic base are fired at 1500°–1800° C. in an inert or a reducing atmosphere in order to fuse the moly-manganese alloy to the ceramic surface. The refractory metal alloy then is plated with gold, or nickel and gold. A microelectronic circuit is inserted within a cavity of the ceramic base through an opening in the base. The microelectronic circuit is connected to feed throughs provided in the base. The opening in the ceramic base is hermetically sealed by covering it with a cover which is soldered in place around the periphery of the opening. Gold plated Kovar lids or ceramic lids provided with gold plated moly-manganese surfaces are used as covers. Soldering takes place in a nitrogen atmosphere using gold-tin solders or tin-silver-antimony solders. This process, while capable of producing good hermetic seals, is characterized by very high cost because of the difficulty of plating refractory metals and the very high firing temperatures.

Epoxy adhesives also have been used to provide seals between a ceramic package and a lid for the package. This method is unsatisfactory because organic vapors from the epoxy sealant may contaminate the microelectronic circuit.

Still another method of forming hermetic seals for a ceramic package is to use a low melting glass which is applied as a glass paste with a carrier solvent. The glass paste is applied to the sealing surface of the ceramic package and then is fused in a furnace. This method is unsatisfactory because it may seal solvents from the glass paste inside the package along with some of the glass itself. The high reliability of the circuit can be destroyed by contamination due to the solvent trapped in the glass interlayer.

An object of the present invention is to provide a method of applying a metal film to a ceramic substrate and obtaining excellent surface coverage and a bond strength of at least 3 MPa, preferably at least 5 MPa.

An object of the invention is to produce a metal plated ceramic substrate which may be used for fine line circuit applications with highly pure metal conductors.

An object of the invention is to provide an electrolessly deposited, direct bonded conductor having excellent adhesion to a ceramic substrate and a process for producing the metal coated ceramic substrate.

An object of the invention is to provide a plated ceramic substrate which has conductors suitable for interconnection for high speed logic circuits and a process for producing the plated substrate.

An object of the invention is to provide a two-sided plated ceramic substrate with a through hole conductor pattern and a conductor density comparable to a three or four layer thick film multilayer ceramic.

It is also an object of the invention to provide a method of joining ceramic articles or other metallized ceramics by soldering, brazing or welding.

An object of the invention is to provide a hermetic seal for ceramic articles.

Additional objects and advantages of the invention will be set forth in part in the description, or may be realized by practice of the invention, the objects and advantages being realized and attained by means of the methods, processes, instrumentalities and combinations particularly pointed out in the appended claims.

SUMMARY OF INVENTION

The present invention is directed to a method of producing metal films on ceramic substrates including alumina, which have excellent surface coverage and bond strength (i.e., at least 3 MPa preferably at least 5 MPa) as measured by the 'dot pull test' described herein below. The present invention also includes ceramic substrates having printed circuit patterns formed from such films. The process of this invention may be used to treat ceramic substrates for electroless or electrolytic metal deposition. Metal deposits on the ceramic substrate are obtained having a thickness of a least 0.2 microns, preferrably at least 2 microns and conductor features typically with a width as low as 25 microns, preferably 50 microns.

The process of this invention comprises the steps of: (a) treating or adhesion promoting the surface of the ceramic with at least one molten inorganic compound; (b) contacting the adhesion promoted surface with a solution capable of promoting adsorption of catalyst on the treated surface; (c) sensitizing or catalyzing the treated surface for plating; and (d) depositing metal on the ceramic surface.

In another embodiment, the process of this invention also includes joining the metallized ceramic substrate to a metal or to another metallized ceramic substrate by soldering, brazing or welding.

DETAILED DESCRIPTION OF THE INVENTION

Any metal film may be deposited on the surface of a ceramic substrate in accordance with the present invention. Typically, copper, nickel, silver or cobalt metal films are electrolessly deposited.

The ceramic surface first is treated at high temperature with a substance which will provide an etched surface necessary to create a strong bond between the metal layer deposited and the ceramic substrate. The preferred materials for this purpose are at least one alkali metal compound in the molten state. The preferred alkali metal compounds include sodium hydroxide, potassium hydroxide, sodium carbonate and potassium nitrate, and potassium hydrogen sulfate.

Suggested procedures for etching with molten alkali are described in U.S. Pat. No. 3,690,921 to Elmore and in Ameen et al., supra. Both of these disclosures described procedures in which sodium hydroxide is heated to a temperature of 450° C. Many alkali metal compounds are suitable for adhesion promotion, e.g., etching of ceramics. It is preferred to use compounds with lower melting points. Alternatively, the melting points of the alkali metal compound(s) may be depressed by dissolving up to about 50% by weight, preferably up to 20% by weight of low melting materials or even liquids in the alkali metal compound. Examples of such melting point depressants are believed to include stannous chloride, nitric acid, water, sodium and potassium formates, potassium acetate, Rochelle salts, borax, and the hydrates of lithium bromide, iodide and phosphate, and potassium pyrophosphate.

Sometimes, it may be preferable to avoid hydroxides for safety reasons and for ease of neutralization. Typical alkali metal compounds suitable for use in this invention and their melting points as reported in *Lange's Handbook of Chemistry*, Eleventh Edition (1972) are as follows:

| Alkali Metal | Melting Points °C. Anion | | | |
| --- | --- | --- | --- | --- |
| | Hydroxide | Nitrate | Carbonate | Hydrogen Sulfate |
| Lithium | 445 | 261 | 618 | 171 |
| Sodium | 328 | 308 | 851 | >315 |
| Potassium | 360 | 334 | 891 | 214 |
| Rubidium | 300 | 310 | 837 | — |
| Cesium | 272 | 414 | — | — |

Eutectic mixtures such as a mixture of potassium hydroxide and sodium hydroxide or a mixture of sodium carbonate and potassium nitrate also may be used to etch the substrate. The former type of mixture preferably has a percent by weight ratio of 59:41 of KOH to NaOH with a melting point of 170° C.

Typical of the ceramic substrates etched by the molten compounds employed herein are aluminas, silicates, beryllias, titanates, forsterite, mullite, steatite, porcelains and mixtures of the foregoing.

Typical of the metal deposition solutions used are electroless plating solutions such as nickel, cobalt, gold, and copper; see U.S. Pat. Nos. 3,485,643 and 3,607,317, 3,589,916 and the like. Electrolytic deposition solutions also may be used in the practice of this invention.

In the processes described by Elmore, sodium hydroxide is rinsed from the ceramic surface with water, and then the ceramic surface is neutralized with dilute sulfuric acid and rinsed again before sensitizing the surface with stannous chloride, rinsing and seeding with palladium chloride to catalyze for electroless metal plating.

These processes are unreliable and frequently result in incomplete surface coverage with electrolessly formed metal deposits. This condition is completely unsatisfactory for production. With prolonged immersion in both the stannous chloride sensitizer solution and the palladium chloride seeder solution as well as incomplete rinsing steps, it sometimes may be possible to get complete surface coverage with metal. These steps, however, are not practical in production. Prolonged immersion in the sensitizer prevents economical throughput of work, and incomplete rinsing after the stannous chloride leads to loosely adhering precipitate particles forming in the seeder and in the electroless plating solutions and to the rapid decomposition of these solutions.

The use of unitary catalyst solutions prepared from both stannous chloride and palladium chloride is well known in the printed circuit and plating-on-plastic arts. Typical catalyst solutions are in U.S. Pat. No. 4,187,198 to Zeblisky and U.S. Pat. No. 3,961,109 to Kremer et al. Such catalyst solutions may be advantageously used in plating on ceramics over the two step sensitizing and seeding solutions as described by Elmore.

Applicants have discovered that adsorption of the species rendering the surface receptive to metal deposition, i.e., sensitizer, seeder or catalysts, and eventually surface coverage of the metal deposit is greatly enhanced by treatment of the etched ceramic surface with a compound that is adsorbed on such ceramic surface and promotes adsorption of the sensitizing species over the whole surface, and surprisingly, provides complete coverage. Among the compounds that can be adsorbed and promote adsorption of the sensitizer are simple chlorides, bromides and iodides, and complexes of chloride bromides and iodides. The invention will be further illustrated by describing the use of acidic chloride, bromide and iodide solutions greater than 0.5 molar in the halide to promote uniform adsorption on ceramic surfaces. These acidic halide solutions do not attack the glassy phase of the ceramic substrate.

The acidic chloride, bromide or iodide solution can be used as a pretreatment or predip solution for the ceramic substrate after adhesion promotion, rinsing, neutralizing and rinsing again; and before treating with, e.g., stannous chloride sensitizer. It has been found that after such pretreatment sensitizer is quickly adsorbed on the etched ceramic substrate. Immersion in the sensitizing solution need not be unduly prolonged. In addition, the tin species is so securely adsorbed that it is not inadvertently removed in a conventional rinsing step.

The acidic chloride, bromide or iodide predip or pretreatment solution preferably is greater than 2 molar in halide ion, and more preferably is greater than 3 molar in halide ion. The acidity of the halide solution preferably is greater than 0.001 molar in hydrogen ion, more preferably is greater than 0.01 molar in hydrogen ion, and most preferrably between 0.1 and 12 molar in hydrogen ion.

Alternatively, applicants have found that the chloride, bromide, or iodide concentration of the sensitizer solution may be increased to accomplish the same desired effect, i.e, more strongly adsorbed sensitizer on the ceramic substrate. High acidity inhibits adsorption of tin sensitizers. The ratio of the halide to acid in a stannous ion sensitizer solution is preferably at least 15 to 1. It is possible to use halide to acid ratios as low as 2 to 1 but these are not preferred because higher tin concentrations, i.e., one molar tin are required.

Although we do not wish to be bound by theory, it is believed that in case of tin comprising solutions, the tin species which is adsorbed on the alumina is the tetrahalostannate (II) moiety. For example, high chloride ion concentration relative to acidity favors the formation of the tetrachlorostannate (II), while high acid concentration favor the formation of trichloro and dichloro stannate (II) complexes. See for example *Stability Constants of Metal Ion Complexes,* Spec. Pub. 17, Sillen and Martell, The Chemical Society, London (1964), pp. 296–7.

When using a unitary catalyst solution comprising a chloride, bromide or iodide of palladium, tin and the halide acid or alkali metal halide salt without an acidic halide predip solution, the halide concentration may be varied over a range from 0.5 to 6 moles per liter, preferably greater than 1.5 moles per liter and preferably less than 4 moles per liter. The acidity may be varied from 0.03 to 6 moles per liter, preferably greater than 0.3 moles per liter and preferably less than 4 moles per liter.

For greater processing latitude and to minimize processing errors, the acidic halide pretreatments may be halide and acid concentrations according to this invention.

Furthermore, the acidic halide predip also may be used with a unitary catalyst solution.

By using an acidic halide predip, other catalytic precious or semiprecious metals may be adsorbed onto the ceramic surface amongst which are the Group IA metals, silver and gold and the other Group VIII precious metals.

Numerous processes are employed in the manufacture of printed circuit boards. As will be understood by those skilled in the art, these printed circuit manufacturing processes may be used in conjunction with the adhesion promoting step of this invention and with the step of rendering the ceramic surface receptive to metallization, in order to produce metallized ceramic printed circuit boards.

According to this invention, there are produced articles and methods which provide a hermetic seal of a metal layer to a ceramic substrate. This invention provides a hermetically sealed ceramic package for microcircuits and other applications. Furthermore, the processes of this invention provide a method of applying an adherent metal film to a ceramic surface which film can be used to join metallized ceramic surfaces or to join metallized ceramic surfaces to metal articles by standard metal joining techniques such as soldering, brazing and welding.

By "hermetic seal" as used throughout this specification, is meant one which passes the *fine leak tests* of MIL-STD-883B, Method 1014.3 (May 16, 1979), incorporated herein by reference.

As will be well understood by those skilled in the art, these hermetic seals are suitable for hybrid packages, chip carriers, integrated circuit packages, flat packs, dual-in-line packages and optoelectronic packages. In forming a hermetic seal to a ceramic substrate by the processes of this invention, a surface of the ceramic substrate is first provided with a metal layer, by the procedures described above. The metal layer on the ceramic surface then is joined to a metal or to another metallized ceramic substrate by standard metal joining techniques, typically soldering.

Other modes of operating this invention are, inter alia, disclosed in the examples.

EXAMPLE I

This example shows how a chloride or bromide containing predip gives uniform surface coverage.

Flat black ceramic substrates, 0.5 mm thick, containing 90% alumina (balance other oxides), were adhesion promoted by immersion in an alkaline cleaning solution (Altrex, commercially available from BASF-Wyandotte, Wyandotte, MI) for 10 minutes at a temperature of 60° C. The substrates then were water rinsed for 1 minute at 25° C., dipped in a solution of sodium hydroxide (760 g/l), removed, and allowed to drain. The resulting wet ceramic substrates were placed on edge in a support fixture. The substrates then were dried for 10 minutes at 175° C. to remove the water in the sodium hydroxide film on the substrate, followed by heating in a furnace for 15 minutes at 450° C. to fuse the sodium hydroxide and roughen and adhesion promote the surface. After cooling for 5 minutes, the ceramic substrates were rinsed in water, rinsed in 20% sulfuric acid at 25° C. for 2 minutes and subsequently rinsed in deionized water for 2 minutes at 25° C.

After this adhesion promotion procedure, the ceramic substrates were electrolessly plated with an adherent copper film by the following procedure.

(a) Immerse in a chloride or bromide predip solution as shown in Table I for 2 minutes at room temperature.
(b) Immerse for 10 minutes at room temperature in a sensitizer solution consisting of 59 grams of stannous chloride dissolved in a liter of 0.12 molar hydrochloric acid solution.
(c) Rinse in deionized water at room temperature.
(d) Immerse for 2 minutes at room temperature in a activator solution of 0.1 grams palladium chloride dissolved in a liter of 0.012 molar hydrochloric acid.
(e) Plate for 30 minutes at room temperature in an electroless copper bath consisting of:

| | |
|---|---|
| Copper sulfate | 10 g/l |
| Ethylenediamine tetra-2-hydroxypropanol | 17 g/l |
| Formaldehyde | 6 g/l |
| Block copolymer wetting agent | 10 mg/l |
| Sodium cyanide | 10 mg/l |
| Sodium hydroxide | To pH 13 |

The effect of the halide predip on the surface coverage of the ceramic substrate is shown in Table I.

TABLE I

| Halide Predip Solution | Surface coverage with Metal |
|---|---|
| 1. None | Unacceptable-some bare spots |
| 2. 1.2 M HCl | Unacceptable-some bare spots |
| 3. 4 M HCl | Complete metal film |
| 4. 6 M HCl | Complete metal film |
| 5. 9 M HCl | Complete metal film |
| 6. 12 M HCl | Complete metal film |
| 7. 1 M NaCl pH < 1 | Unacceptable-some bare spots |
| 8. 3.4 M NaCl pH < 1 | Good-complete metal film |
| 9. 5 M NaBr pH < 1 | Good-complete metal film |
| 10. 3.8 M NaCl 0.1 M HCl 0.25 M SnCl$_2$ | Good-complete metal film |

Unacceptable coverage means a copper deposit with good color and adhesion but some skip plating or bare spots. Complete metal film means a copper film of good color and adhesion and complete coverage without bare spots or skip plating.

In all cases, even when there was incomplete surface coverage, adhesion of metal to the ceramic was excellent.

EXAMPLE II

This example shows the effect of the pH of the halide predip solution.

The procedures of example I were repeated except that the halide predip solutions and the results obtained were as shown in Table II.

TABLE II

| Halide Predip Solution | Surface Coverage with Metal |
|---|---|
| 1. 3.8 M NaCl pH < 1 | Good-complete metal film |
| 2. 3.8 M NaCl pH = 5 | Unacceptable-some bare spots |
| 3. 3.8 M NaCl pH = 8 | Unacceptable-less than 75% coverage |

EXAMPLE III

The procedure of Example I was repeated except that the halide predip was eliminated, and the sensitizer solution in step (d) was modified by the addition of sodium chloride. The sensitizer solution was:

| | |
|---|---|
| stannous chloride | 50 g/l |
| hydrochloric acid | 8 ml/l |
| sodium chloride | 180 g/l |

After plating the ceramic substrate in the electroless copper bath of Example 1, it had a complete copper film over the ceramic substrate which was free of voids or the like. Thus, by increasing chloride concentration in the sensitizer solution compared to Example I, complete coverage of the ceramic substrate with a copper film is achieved without the use of a separate halide predip solution step.

EXAMPLE IV

This example further illustrates the importance of the halide concentration in the pretreatment step of ceramic substrates before electroless plating.

The ceramic substrates were adhesion promoted by the procedures as in Example I.

A catalyst concentrate was prepared according to the procedure disclosed in U.S. Pat. No. 3,961,109 to Kremer et al. An aqueous solution comprising palladium chloride, stannous chloride, sodium chloride, hydrochloric acid and resorcinol was prepared and heated. After cooling, the solution was diluted with additional sodium chloride, stannous chloride and hydrochloric acid to obtain a standard concentrate catalyst solution. Thirty-one milliliters of this concentrate were diluted to one liter to obtain the working catalyst solutions. For a high chloride catalyst solution, the 31 ml of concentrate was diluted with a solution of 3.8 molar sodium chloride, 0.11 molar hydrochloric acid and 0.025 molar stannous chloride. For a low chloride catalyst solution, the 31 ml of concentrate was diluted with a 0.18 molar solution of sulfuric acid. Two catalyst solutions with intermediate chloride concentrations were prepared by diluting 31 ml of the concentrate with 0.36 molar hydrochloric acid solution, and with a 0.36 molar hydrochloric acid solution 1 molar in sodium chloride, respectively. These four catalyst solutions had the compositions shown below.

| | Catalyst Composition - grams/liter Chloride | | | |
|---|---|---|---|---|
| | High | Intermediate | | Low |
| Palladium | 0.15 | 0.15 | 0.15 | 0.15 |
| Stannous Chloride | 23 | 18 | 18 | 18 |
| Sodium Chloride | 226 | 63.8 | 5.6 | 5.6 |
| Hydrogen Chloride | 4.6 | 11.7 | 11.7 | 0.6 |
| Resorcinol | 1.2 | 1.2 | 1.2 | 1.2 |
| Sulfuric Acid | 0 | 0 | 0 | 18 |
| Total Chloride | 150 | 56 | 21 | 10 |

These catalyst solutions are stable, active catalysts and are widely used in the plating on plastics industry and for making plated-through-hole printed circuits on epoxy resin laminates.

The etched ceramic substrates were metallized by the following procedure.

(1) Immerse the substrates in the catalyst for 5 minutes at room temperature.
(2) Rinse in deionized water.
(3) Immerse in an accelerator solution comprising 3% fluoroboric acid in water.
(4) Rinse in deionized water.

After the electroless metal plating, the substrates contacted with the high halide catalyst and the intermediate catalyst containing 56 grams/liter chloride were completely covered with a uniform film of metal while the ceramic substrates contacted with the low halide catalyst and the intermediate catalyst containing only 21 grams chloride per liter had skip plating, i.e., small areas of the ceramic without copper plating.

EXAMPLE V

Adhesion of electrolessly deposited metal to the ceramic substrate was tested by the "dot pull test".

Instead of plating the substrates in the room temperature electroless copper solution of Example I, the substrates were plated in an electroless copper solution of the following composition for 2½ hours to deposit copper 10 micrometers thick on the substrates.

| | |
|---|---|
| Ethylenedinitrilotetra-2-propanol | 18 g/l |
| Copper Sulfate Pentahydrate | 10 g/l |
| Formaldehyde | 1.6 g/l |
| Wetting Agent* | 0.01 g/l |
| Sodium Cyanide | 25 mg/l |
| 2-Mercaptobenzothiazole | 0.01 mg/l |
| Sodium Hydroxide | to pH 12.8 |
| Temperature | 52° C. |

*Nonyl phenoxy polyglycidol phosphate ester commercially available from GAF Corp. as Gafac RE610. The substrates were adhesion promoted by the procedures as described in Example I.

The adhesion promoted ceramic substrates were metallized by the following procedure:
(1) Immerse for 2 minutes in a room temperature aqueous halide predip solution of 3.8 moles sodium chloride, 0.1 moles hydrochloric acid and 0.025 moles stannous chloride per liter.
(2) Immerse at room temperature for 15 minutes in the high chloride catalyst solution of Example IV.
(3) Rinse in deionized water.
(4) Immerse in the accelerator solution of Example IV.
(5) Rinse in deionized water.
(6) Plate in electroless copper deposition solution.
(7) Rinse and dry.

The substrates then were imaged and etched by conventional photolithographic techniques thus producing copper dots 2.5 mm in diameter. Wires were attached to the copper dots with solder and an average bond strength of 10.8 MPa was measured as the dots were pulled away from the ceramic surfaces.

EXAMPLE VI

Ceramic substrates were adhesion promoted by the method of Example I, immersed for 10 minutes in a 3 Molar hydrochloric acid solution, rinsed in deionized water for 1 minute, immersed in a 0.1 Molar silver nitrate solution, rinsed in deionized water, and immersed for 30 minutes in the electroless metal deposition solution of Example I. The substrate was completely and uniformly covered with an adherent copper metal film.

The procedure was repeated except that after immersion in 3 Molar hydrochloric acid and rinsing, the substrate was immersed for 2 minutes in a 0.9 Molar nitric acid solution before the immersion in the 0.1 Molar silver nitrate solution. When the ceramic substrate then was rinsed and immersed in the electroless copper deposition solution, no copper deposition occurred. The 0.9 Molar nitric acid solution was tested for the presence of chloride by adding silver nitrate dropwise. A white precipitate formed. This shows the halide of this invention is necessary on the ceramic surface to form catalytic silver sites which initiate electroless copper deposition, and furthermore that the halide on the ceramic surface easily can be removed by improper processing.

This also shows that insoluble AgCl, because it is less easily rinsed away than SnCl$_2$, can operate with lower chloride ion concentration on the surface, i.e., with a water rinse between the halide predip and the AgCl catalyst.

EXAMPLE VII

A white ceramic substrate was adhesion promoted by the method of Example I; immersed for 10 minutes in 3 Molar hydrochloric acid solution, rinsed in deionized water for 1 minute, immersed in a 0.1 Molar silver nitrate solution, rinsed in deionized water and dried. The ceramic substrate then was exposed to light. The surface darkened indicating that the adsorbed silver chloride was reduced to metallic silver sites by the light. Alternately, the silver chloride is reduced to metal with a reducing agent.

EXAMPLE VIII

The procedures of Example I were repeated except that white ceramic substrates, 0.4 mm thick which were 96% alumina were substituted for the black substrates of 90% alumina. The similar results were obtained.

EXAMPLE IX

A white 96% alumina substrate, 30 mm × 30 mm and 0.4 mm thick was adhesion promoted by the procedure of Example I. It then was coated with copper by the following procedure.
(1) Immerse for 5 minutes in an aqueous conditioner solution containing a amphoteric surfactant (tallow betaine surfactant) a nonionic surfactant (nonylphenoxy polyethoxyethanol) and ethanolamine, the solution adjusted to pH 2.
(2) Rinse in water.
(3) Immerse for 2 minutes in the halide predip solution of example V.
(4) Immerse for 5 minutes in the catalyst solution of example V.
(5) Rinse in water.
(6) Electrolessly deposit copper by the electroless copper plating solution of Example I.

A uniform coating of copper was obtained free of voids and skip plating. The copper clad ceramic was coated with a polyvinylcinnamate polymer (KPR, commercially available from Eastman Kodak Company), exposed, and developed with KPR Developer Solution to produce the negative resist image of a chip carrier on the copper clad substrate. The exposed copper surface, which was the desired chip carrier pattern, was electroplated in a copper plating solution (Copper Gleam PC commercially available from Lea Ronal, Inc., Freeport, NY) to a copper thickness of 0.01 mm. The resist then was removed with solvents, and the electroless copper film, outside the chip carrier image pattern, was removed by immersion in a solution of sodium persulfate, thus producing a finished chip carrier with 132 conductors on 0.14 mm pitch fanning out to 0.36 mm pitch.

EXAMPLE X

The procedure of Example IX was repeated on both 90% and 96% alumina substrates using 0.4 mm thick substrates 75 mm by 75 mm. Instead of a chip carrier conductor pattern, eight copies of a copper conductor pattern for a hybrid circuit A/D (analog to digital) converter were produced on each substrate. The hybrid circuit conductor patterns have 125 micrometer wide pure copper conductors, input and output connections and all the interconnections for six integrated circuits and associated chip capacitors and resistors. After the circuit patterns were completed by removing the electroless copper film in the background, the individual hybrid circuits were cut out of the 75 mm by 75 mm wafer by a laser. Alternately, the individual circuit patterns are laser cut after the integrated circuits and chip resistors and capacitors are emplaced.

EXAMPLE XI

Example X was repeated except that the hybrid circuit conductor patterns were electroplated with nickel and gold over the electroplated copper. This produced a circuit with a clean smooth pure gold surface which is superior for wire bonding over screened gold paste thick film circuits.

EXAMPLE XII

A 64 pin chip carrier was produced on alumina substrate. The substrate was provided with laser drilled holes 0.4 mm in diameter and the chip carrier was produced by the method of Example IX except that the conductor pattern was plated through the holes and onto the reverse side.

EXAMPLE XIII

Additive hybrid circuit conductor patterns are produced by adhesion promotion of ceramic substrates and treating with a conditioner, catalyst and rinsing after the catalyst solution as in Example V. Next the substrates are dried and a polymeric dry film photo resist (Riston 1401 commercially available from E. I. Dupont de Nemours & Co.) is applied to substrate, exposed to ultraviolet light, and developed by conventional means to produce the image of the hybrid circuit conductor patterns. The substrate then is immersed in the electroless copper plating solution of Example V for 2½ hours thus depositing a pure copper conductor pattern 10 micrometers thick. To complete the circuit, the background resist is removed with solvent.

EXAMPLE XIV

The procedure of Example V is repeated except that instead of an etched the dot pattern, a hybrid circuit conductor pattern is produced by photolithography.

EXAMPLE XV

A ceramic substrate, 96% alumina, was adhesion promoted by the following procedure.
(a) Immerse in an alkaline cleaning solution at 60° C.
(b) Rinse in water.
(c) Dry in a hot air oven at 160° C.
(d) Immerse the substrate in a molten sodium and potassium hydroxide eutectic solution of 205 grams sodium hydroxide and 295 grams potassium hydroxide at 210° C. for 10 minutes.
(e) After cooling rinse in water at room temperature for 5 minutes.
(f) Neutralize in 3 Molar hydrochloric acid solution for 2 minutes.
(g) Rinse in deionized water.

The adhesion promoted substrate then was plated with an adherent copper film by the procedures of Example IX, steps 1 through 6. A uniform, adherent coating of copper was obtained free of voids, blisters, bubbles and skip plating.

EXAMPLE XVI

A ceramic substrate, 90% alumina, is adhesion promoted by: (1) immersing in a hot alkaline cleaning solution, (2) rinsing in water, (3) dipping in an aqueous 2.8 molar solution of potassium hydrogen sulfate, (4) drying the ceramic substrate in a oven at 160° C. and (5) fusing the potassium hydrogen sulfate on the surface of substrate at 450° C. Then the substrate is washed with water and immersed in a 10% sulfuric acid solution and washed again.

The adhesion promoted substrate then is metallized by the procedure of Example XV. A uniform, adherent coating of copper is obtained, free of blisters, voids and skip plating.

EXAMPLE XVII

Four grams of sodium carbonate was ground together with one gram potassium nitrate. These dry, mixed powders were poured onto a black ceramic substrate, 90% alumina, (commercially available as BA-912 from NTK Technical Ceramic Division of NGK Spark Plug Co., Ltd. Mizuho, Nagoya, Japan). The substrate, covered with powder, was placed in an oven and heated to 700° C. for twenty minutes fusing the powder. After cooling, the substrate was rinsed with water, immersed in a 10% solution of nitric acid and rinsed again in water. The adhesion promoted substrate then was metallized as in Example XVI. A uniform, adherent coating of copper was obtained, free of blisters, toids and skip plating.

EXAMPLE XVIII

A ceramic substrate comprising silicon carbide and beryllia was provided with an adherent hybrid circuit pattern of pure copper conductors by the procedures of Example XIII. This produced a strongly adherent copper circuit pattern on a high beryllia substrate with excellent heat transfer characteristics.

EXAMPLE XIX

The procedure of Example III is repeated except that an electroless nickel plating bath is substituted for the electroless copper plating bath. Electroless nickel plating baths are well known. The electroless nickel plating bath (commercially available from Allied- Kelite Div. of the Richardson Co., 2400 E. Devon Ave., Des Plaines, IL 60018 as Niklad 794) comprises nickel salts, sodium hypophosphite, ammonium hydroxide with a pH 4.5–5.2 (measured at 25° C.) and is operated at 90° C. After 30 minutes immersion in the electroless nickel plating bath, the ceramic substrate is removed. It is completely covered with no skip plating, by a uniform adherent deposit of nickel, 10 micrometers thick.

EXAMPLE XX

A ceramic substrate (96% alumina) was adhesion promoted by the procedure of Example I. It was provided with a conductive border by painting the edges with silver paint. The substrate was (1) immersed for 5 minutes in the aqueous conditioner solution of example IX; (2) rinsed in water; (3) immersed for 5 minutes in the halide predip solution of Example V; (4) immersed for 10 minutes at 40° C. in the catalyst solution of example V; (5) rinsed in water; (6) dipped for 5 seconds in an aqueous solution 3.5% fluoroboric acid and 0.4% hydroxyethylethylenedinitrilotriacetic acid; (7) electroplated with copper in an aqueous solution 75 g/l copper sulfate, 190 g/l sulfuric acid, 50 mg/l chloride ion and 1 g/l Pluronic F-127 (a block copolymer of polyoxyethylene and polyoxypropylene commercially available from BASF - Wyandotte Corp, Wyandotte, MI). The current density was 0.35 mA/mm$^2$.

EXAMPLE XXI

A ceramic lid made to fit over the opening in a hybrid circuit package was adhesion promoted by the procedure of Example I. The ceramic lid was then metallized with copper by the following procedure:

(a) Immerse for 2 minutes in a room temperature aqueous chloride predip solution of 3.8 moles sodium chloride, 0.1 moles by hydrochloric acid and 0.025 moles stannous chloride per liter.
(b) Immerse for 15 minutes in the high chloride catalyst solution of Example IV.
(c) Rinse in water.
(d) Immerse in the accelerator solution of Example IV.
(e) Rinse in water.
(f) Plate with copper from the electroless copper deposition solution of Example V.
(g) Rinse and dry.

The metallized ceramic lid was electroplated with a tin-lead (solder) alloy from a conventional tin-lead fluoroborate electroplating solution. The tin-lead alloy deposit was of the eutectic composition. The electrodeposited solder was reflowed with heat. The metallized ceramic lid was positioned on top of the opening in the hybrid circuit package to close the package. The periphery of the opening had a metallized layer covered with solder. A force was applied with a weight on the top of the ceramic lid. The metallized ceramic lid was hermetically sealed to the hybrid circuit package by passing the package and lid, under nitrogen atmosphere, through a belt furnace maintained at 20° C. above the eutectic melting point of the solder alloy. The assembly was cooled to room temperature and the weight was removed.

The seal of the hybrid circuit package to the lid was tested and was a hermetic seal as defined by MIL-STD-883.

What is claimed is:

1. In a process for metallizing a surface of a ceramic substrate which includes treating the surface to adherently receive metal and depositing metal on the treated surface, the improvement which comprises:
   treating the surface with a melt comprising one or more alkali metal compounds;
   exposing said surface, in a later step, to an acidic halide solution containing one or more halides selected from the group consisting of chlorides, bromides and iodides and having an acidity and a halide concentration sufficient to promote adsorption of catalyst on the surface and eliminate bare spots in an adherent metal layer formed on the surface or selected parts thereof, wherein said acidic halide solution is greater than 1.5 molar in halide ion and has an acidity greater than 0.001 molar in hydrogen ion;
   treating said surface with a catalyst solution for rendering said surface receptive to deposition of metal; and
   exposing the thus treated surface or selected parts of said surface to a metal depositing bath solution thus forming a uniform metal layer on said surface or selected parts thereof.

2. The process of claim 1 wherein said acidic halide solution is greater than 3 molar in halide ion.

3. The process of claim 1 wherein said acidic halide solution has an acidity greater than 0.01 molar in hydrogen ion.

4. The process of claim 1 wherein said acidic halide solution constitutes part of said catalyst solution used for rendering said surface receptive to deposition of metal and said catalyst solution contains from 1.5 to 6 moles of halide per liter and has an acidity from 0.03 to 6 moles per liter.

5. The process of claim 4 wherein said catalyst solution contains less than 4 moles of halide per liter.

6. The process of claim 4 wherein said catalyst solution has an acidity from 0.03 to 4 moles per liter.

7. A process as defined in claim 1 wherein said alkali metal compound is selected from hydroxides, carbonates, nitrates and hydrogen sulfates and mixtures thereof.

8. A process as defined in claim 1 wherein said melt further includes one or more materials which depress the melting point of said alkali metal compound(s).

9. A process as defined in claim 1 wherein said melt further includes up to about 20% by weight of one or more materials which depress the melting point of said alkali metal compound(s).

10. A process as defined in claim 1 wherein said alkali metal compound is selected from carbonates and nitrates and mixtures thereof.

11. A process as defined in claim 1 wherein the acidic halide solution is selected from hydrochloric acid, hydrobromic acid, and acidic alkali metal halide solutions, said alkali metal selected from sodium and potassium, and said halide selected from bromide, chloride and iodide.

12. A process as defined in claim 1 wherein the said acidic halide solution is a solution which further includes stannous chloride.

13. A process as defined in claim 1 wherein the acidic halide solution comprises stannous chloride and is employed as the sensitizer solution prior to treating the surface with seeding solution selected from noble metal comprising solutions.

14. A process as defined in claim 4 wherein said acidic halide solution comprises an admixture resulting from reacting tin (II) chloride and a precious metal halide forming a compound suitable for rendering surfaces receptive to electroless depositing of metal.

15. A process as defined in claim 1 wherein subsequent to treating the surface with the acidic halide solution selected from chlorides, bromides and iodides, it is further treated with a silver nitrate solution to render it receptive to electroless deposition of metal.

16. A process as defined in claim 1 wherein subsequent to treating the surface with the acidic halide solution selected from chloride, bromides and iodides, it is further treated with a silver nitrate solution forming silver halide which is reduced to metal with light or a reducing agent.

17. A process as defined in claim 1 wherein a first metal layer is electrolessly formed and said layer is further plated up with one or more metals employing electroless or electroplating methods.

18. A process as defined in claim 1 wherein the alkali metal compound is heated above 150° C.

19. A process as defined in claim 1 wherein the alkali metal compound is heated above 300° C.

20. A process as defined in claim 1 wherein the alkali metal compound is heated above 600° C.

21. A process as defined in claim 1 wherein the acidic halide solution is used as a pretreatment step before the catalyzing sequence, and the ceramic substrate proceeds from the pretreatment step to the catalyzing sequence without rinsing.

22. Method of making a printed circuit on a surface of a ceramic substrate comprising:

treating the ceramic substrate with a molten alkali metal compound to adhesion promote or etch the surface;

exposing the surface to acidic halide solution containing one or more halides selected from the group consisting of chlorides, bromides, and iodides having an acidity and a halide concentration sufficient to eliminate bare spots in an adherent metal layer formed on the surface or selected parts thereof, wherein the acidic halide solution contains at least 1.5 moles of halide per liter;

treating the ceramic surface with a catalyst for electroless metal deposition;

depositing metal onto the catalyzed surface; and removing portions of the deposited metal to produce a metal printed circuit conductor pattern adhering to the surface of the ceramic substrate.

23. Method of claim 22 wherein the acidic halide solution comprises the catalyst and said solution contains from 1.5 to 6 moles of halide per liter and has acidity from 0.03 to 6 moles per liter.

24. Method of claim 22 wherein the substrate is exposed to the acidic halide solution prior to catalyzing with a catalyst for electroless metal deposition and the acidic halide solution is greater than 2 molar in halide ion and has an acidity greater than 0.001 molar in hydrogen ion.

25. Method of claim 24 wherein the substrate is transferred from the acidic halide solution to a catalyst solution without rinsing.

26. Method of claim 22 wherein metal is deposited by electroplating.

27. Method of claim 22 wherein portions of the deposited metal are removed by etching.

28. Method of claim 22 wherein the printed circuit comprises plates holes with metal plated walls.

29. Method of making printed circuit on a surface of a ceramic substrate comprising:

exposing the surface to a molten alkali metal compound to roughen or adhesion promote the surface;

exposing the surface to an acidic halide solution having an acidity and containing one or more halides in an amount sufficient to eliminate bare spots in an adherent metal layer formed on selected parts of the surface, and sufficient to promote absorption of a catalyst for electroless metal deposition, the halides selected from chlorides, bromides, and iodides, wherein the acidic halide solution contains at least 1.5 moles of halide per liter;

catalyzing the exposed surface with a catalyst for electroless metal deposition;

printing a resist outlining a conductor pattern on the catalyzed surface; and electrolessly depositing metal on the part of the catalyzed surface not printed with resist, thus making an adherent metal printed circuit conductor pattern on the substrate.

30. A process for producing a metallized conductor pattern on a ceramic substrate comprising:

contacting a surface of said substrate with a melt comprised of an alkali metal compound for a time period sufficient to etch said surface;

rinsing said surface with an aqueous solution;

neutralizing said surface with an acid;

repeating said rinsing step;

contacting said surface with an acidic halide solution containing one or more halides, the halides being selected from the group consisting of chlorides, bromides and iodides, the solution containing sufficient halide ions to promote adsorption of a stannous chloride sensitizer, eliminate bare spots in an adherent metal layer formed on the surface or selected parts thereof, and provide a pH below about 2 at said surface, wherein said acidic halide solution is greater than 2 molar in halide ion;

contacting said surface with a sensitizer solution providing stannous tin ions and a seeding solution providing precious metal ions, in the presence of said acidic halide solution, to render said surface receptive to electroless deposition of a metal; and contacting said surface or selected parts thereof with a metal depositing solution for a time period sufficient to form a metal layer thereon.

31. A process defined in claim 30 wherein after contacting the surface with the acidic halide solution, it is contacted with the sensitizer solution without an intermediate rinse.

32. In a process for metallizing a surface of a ceramic substrate which includes treating the surface to adherently receive a metal, and depositing metal on the treated surface, the improvement which comprises:

treating the surface with a melt comprising one or more alkali metal compounds;

providing the surface with a conductive connector area for cathodic connection in subsequent electroplating;

exposing said surface to an acidic halide solution having an acidity from 0.03 to 6 moles per liter and containing halide selected from the group of chlorides, bromides or iodides in an amount greater than 0.5 moles per liter and sufficient to promote adsorption of metal ions selected from Group Ib and Group VIII of the Periodic Table of Elements and to eliminate bare spots in an adherent metal layer formed on the surface or selected parts thereof;

treating said surface with a solution comprising a metal selected from Group Ib and Group VIII of the Periodic Table of Elements to deposit metallic sites on the surface;

connecting said connectors area to the cathode pole of a power supply;

contacting the surface with a solution for electroplating a second metal the anode of the power supply being in contact with said solution;

and electroplating the second metal on the surface to form a complete layer of said second metal on said surface or selected parts thereof.

* * * * *

UNITED STATES PATENT AND TRADEMARK OFFICE
CERTIFICATE OF CORRECTION

PATENT NO. : 4,604,299

DATED : August 5, 1986

INVENTOR(S) : Michael A. DeLuca et al.

It is certified that error appears in the above-identified patent and that said Letters Patent is hereby corrected as shown below: On The Title Page:

On front page of patent: In the "References Cited", change "Statnecker" to --Stalnecker--; In "Other Publications", change --Bandrand" to --Baudrand--;

Column 2, line 49, change "block" to --black--;

Column 2, line 59, change "subblisters" to --substrate --;

Column 3, line 4, change "Statnecker" to --Stalnecker--;

Column 9, line 50, in Table II, Example II, delete "coverage".

Column 14, line 21, change "toids" to --voids--.

Signed and Sealed this

Eighth Day of November, 1988

Attest:

DONALD J. QUIGG

*Attesting Officer*  *Commissioner of Patents and Trademarks*